United States Patent [19]
Chandross et al.

[11] Patent Number: 6,136,702
[45] Date of Patent: Oct. 24, 2000

[54] THIN FILM TRANSISTORS

[75] Inventors: Edwin Arthur Chandross, Murray Hill; Brian Keith Crone, Kingston; Ananth Dodabalapur, Millington; Robert William Filas, Bridgewater, all of N.J.

[73] Assignee: Lucent Technologies Inc., Murray Hill, N.J.

[21] Appl. No.: 09/450,525

[22] Filed: Nov. 29, 1999

[51] Int. Cl.[7] .................................................. H01L 21/44
[52] U.S. Cl. ........................ 438/678; 438/608; 438/625; 438/650; 438/678; 438/687
[58] Field of Search ................................... 438/678, 608, 438/625, 642, 650, 652, 629, 687, 913, 908; 427/98, 304, 305, 306

[56] References Cited

U.S. PATENT DOCUMENTS

| | | | |
|---|---|---|---|
| 4,804,559 | 2/1989 | Ushio et al. | 427/96 |
| 4,963,974 | 10/1990 | Ushio et al. | 357/80 |
| 5,202,151 | 4/1993 | Ushio et al. | 427/98 |
| 5,824,599 | 10/1998 | Schacham-Diamand et al. | 438/678 |
| 5,830,805 | 11/1998 | Shacham-Diamand et al. | 438/678 |

FOREIGN PATENT DOCUMENTS

| | | | | |
|---|---|---|---|---|
| 5-222541 | 8/1993 | Japan | | 18/42 |
| 5-287541 | 11/1993 | Japan | | 18/42 |
| 8-291389 | 11/1996 | Japan | | 18/42 |
| 10-147884 | 6/1998 | Japan | | 18/44 |
| 10-147885 | 6/1998 | Japan | | 18/50 |
| 10-256705 | 9/1998 | Japan | | 1/9 |
| 11-195654 | 7/1999 | Japan | | 21/288 |

*Primary Examiner*—Charles Bowers
*Assistant Examiner*—Laura Schillinger
*Attorney, Agent, or Firm*—Thomas, Kayden, Horstemeyer & Risley LLP

[57] ABSTRACT

The specification describes source/drain contact material that is compatible with organic semiconductors in thin film transistor integrated circuits. The contact material is nickel/gold wherein the nickel is plated as Ni—P on a base conductor, preferably $TiN_x$, by electroless plating, and the gold overlay is deposited by displacement plating. It was found, unexpectedly, that forming Ni/Au contacts in this way extends the lifetime of TFT devices substantially.

6 Claims, 9 Drawing Sheets

THIN FILM TRANSISTORS

FIELD OF THE INVENTION

This invention relates to improvements in thin film transistors (TFTs), and more particularly to improvements in TFT devices with organic semiconductors.

BACKGROUND OF THE INVENTION

Over the last decade, IC technologies have been proposed that use organic semiconductor thin film transistors (TFTs). The chief attractions of such circuits stem from the anticipated ease of processing and compatibility with flexible substrates. These advantages are expected to translate into a low-cost IC technology suitable for applications such as smart cards, electronic tags, and displays.

TFT devices are described in F. Garnier et al., Science, Vol. 265, pp. 1684–1686; H. Koezuka et al., Applied Physics Letters, Vol. 62 (15), pp. 1794–1796; H. Fuchigami et al., Applied Physics Letters, Vol. 63 (10), pp. 1372–1374; G. Horowitz et al., J. Applied Physics, Vol. 70(1), pp. 469–475; and G. Horowitz et al., Synthetic Metals, Vol. 42–43, pp. 1127–1130. The devices described in these references are based on polymers or oligomers as the active materials, in contrast with the amorphous silicon and polysilicon TFT structures that were developed earlier. The devices are typically field effect transistors (FETs). Polymer active devices have significant advantages over semiconductor TFTs in terms of simplicity of processing and resultant low cost. They are also compatible with polymer substrates used widely for interconnect substrates. Polymer TFTs are potentially flexible, and polymer TFT ICs can be formed directly on flexible printed circuit boards. They also have compatible coefficients of thermal expansion so that solder bonds, conductive expoxy bonds, and other interconnections experience less strain than with semiconductor IC/polymer interconnect substrate combinations. While metal-insulator-semiconductor (MIS) FET devices are most likely to find widespread commercial applications, TFT devices that utilize both p-type and n-type organic active materials are also known. See e.g., U.S. Pat. No. 5,315,129. S. Miyauchi et al., Synthetic Metals, 41–43 (1991), pp. 1155–1158, disclose a junction FET that comprises a layer of p-type polythiophene on n-type silicon.

Recent advances in polymer based TFT devices are described in U.S. Pat. No. 5,596,208, issued May 10, 1996, U.S. Pat. No. 5,625,199, issued Apr. 29, 1997, and U.S. Pat. No. 5,574,291, issued Nov. 12, 1996. With the development of both n-type and p-type active polymer materials, as described in these patents, complementary ICs can be readily implemented, as detailed particularly in Pat. No. 5,625,199.

With the basic organic TFT technology now well established, refinements in the device structures and processing can be expected. Among the problems remaining to be satisfactorily addressed is premature device failure due to contamination, or poisoning, of the organic semiconductor on aging.

SUMMARY OF THE INVENTION

We have found that effective lifetimes of organic semiconductor devices can be strongly influenced by the metallurgy systems in contact with the organic semiconductor, and the history of the metallurgy. More specifically, we have found that gold electrodes for organic semiconductor TFT devices that are processed in the conventional way result in premature device failure. In accordance with the invention, gold contacts for organic semiconductor TFT devices are formed by displacement plating. A preferred contact for organic semiconductor TFT devices is $TiN_x/Ni/Au$ wherein the nickel layer (typically Ni—P) is produced by electroless plating, and the gold layer is produced by displacement plating. To simplify processing, the $TiN_x$ base layer can be replaced by a printed layer of seed material for electroless nickel deposition. These TFT device structures have been demonstrated to have considerably extended lifetimes.

DETAILED DESCRIPTION

Figure 1:
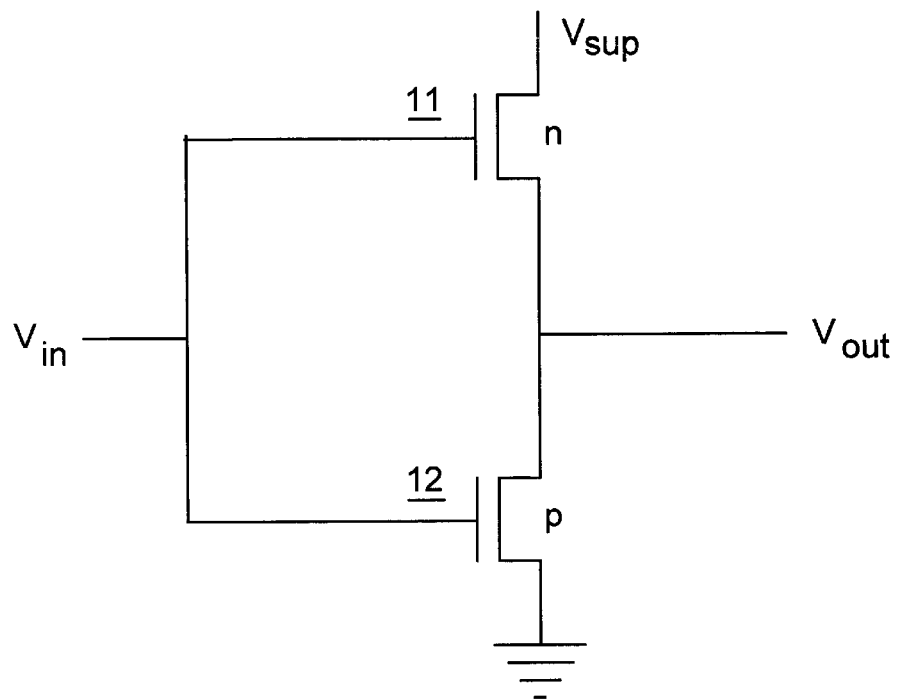
FIG. 1 is a schematic circuit diagram for a simple inverter using a CMOS pair of TFT devices fabricated in accordance with the invention.

A processing sequence for making TFT CMOS devices with the electrodes of the invention is described as follows in conjunction with FIGS. 1–19. The device used for illustration is a CMOS pair for the simple inverter circuit of in FIG. 1, where n-channel TFT is designated 11 and p-channel TFT is designated 12. The p-channel transistor may be used as driver for the n-channel load.

The TFT device structure used for the process illustration is the upside-down configuration that is described and claimed in U.S. patent application Ser. No. 09/137,920 filed Aug. 20, 1998, which is incorporated herein by reference. This TFT structure offers several advantages. It can be made with simple processing. The deposition of the semiconductor layer occurs late in the process thus avoiding hostile process conditions such as etchants, cleaning agents, high temperature, etc. Importantly, the upside down structure, as described here, has inherent electrical isolation between devices in a CMOS pair as well as between pairs. Moreover, the structure allows interconnection layers to be formed prior to transistor formation, which feature has important advantages in some technologies.

Figure 2:
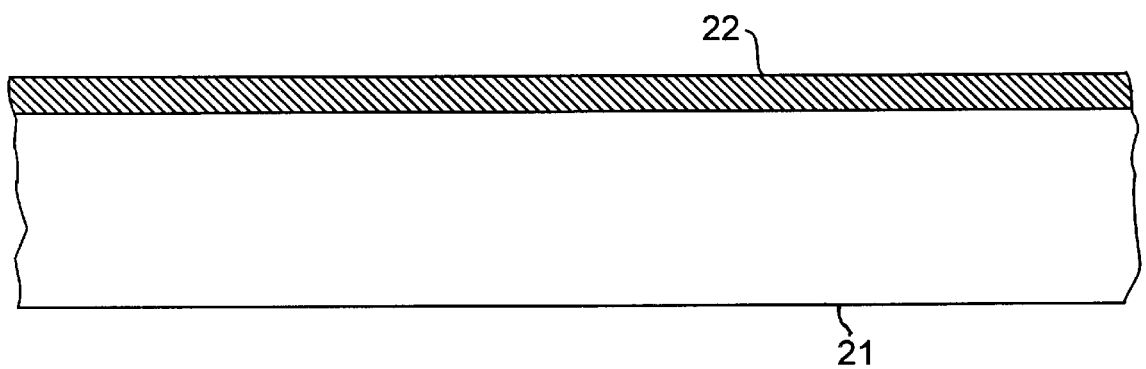
FIGS. 2–19 are schematic representations of process steps useful for forming the organic semiconductor TFT CMOS inverter circuit of FIG. 1.

Referring to FIG. 2, a portion of an IC substrate is shown at 21. A single TFT CMOS pair will be illustrated for simplicity, but it will be understood that the single pair of devices is representative of a large integrated array of devices. Also, the features shown in the figures herein are not to scale. Substrate 21 is an insulating material such as ceramic, glass, or a polymer. It may be rigid or flexible, and it may comprise a standard printed circuit substrate of glass reinforced epoxy, or polyimide. Alternatively it may be silicon on which an insulating layer of $SiO_2$ is grown or deposited. The first level metal is shown at 22. In this inverted structure this level is referred to as the first level because it is formed first but, as will be appreciated by those skilled in the art, it corresponds to the second or third level metal in traditional structures. The metal may be any of a variety of conductive materials. The common choice in standard IC technology is aluminum. However, due to the nature of the structures described here the choice of conductive material can be made from a larger universe than is usually considered, including the standard materials, i.e. aluminum, TiPdAu, TiPtAu, $TaN_x$, $TiN_x$, Au, Ni, etc., as well as non-traditional choices most notably copper, and conductive polymers such as polyaniline and metal-containing polymer inks. The use of polymer conductors may be favored in applications where a degree of flexibility is desired. The choice of deposition technique is wide since the structures at this stage in the processing, as contrasted with traditional IC processing at this stage, have no thermally sensitive components. Thus this deposition step, as well as subsequent deposition and etching steps used for forming the two level or multi-level metallization interconnections, may involve significant substrate heating if that is otherwise convenient and cost effective. Accordingly, the metal layer can be evaporated, or sputtered. The thickness of the metal layer can vary widely, but will typically be in the range 0.05 to 2 $\mu$m.

Figure 3:
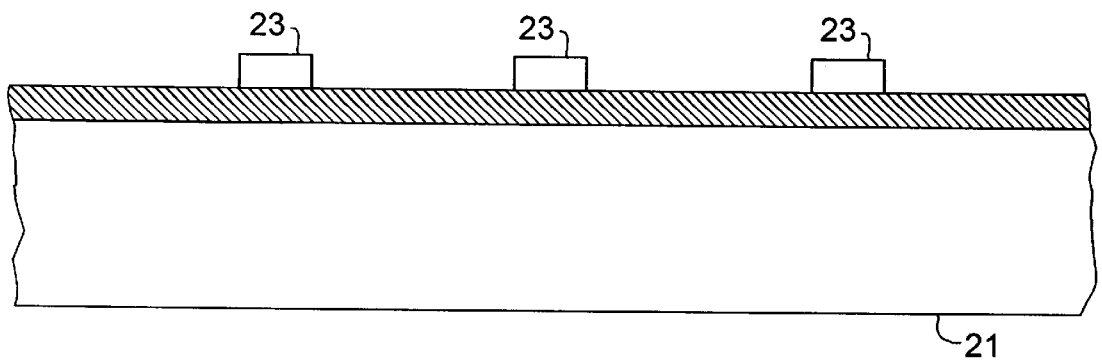
Figure 4:
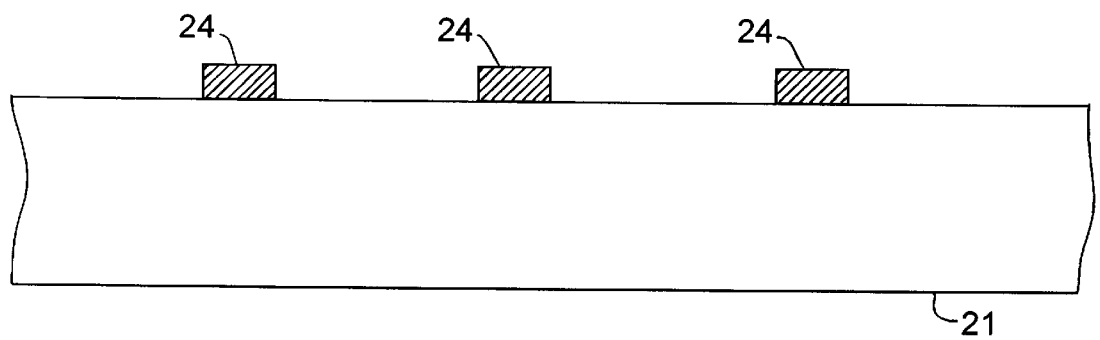

The next step, represented by FIG. 3, is to pattern the first level metallization using a lithographic mask 23. The mask is typically made by photolithography, but may also be formed using other forms of lithography. Other masking steps, to be described below, may also utilize these alternative lithography technologies. The first metal layer is then patterned by standard etching, e.g. plasma or RIE etching, to produce the pattern of metal runners 24 as shown in FIG. 4.

With a wide choice of conductive materials available, it may be useful, in applications where the interconnect density is not large, to print the circuit directly, using screen printing, stenciling, ink jet printing, or a similar technique.

Figure 5:
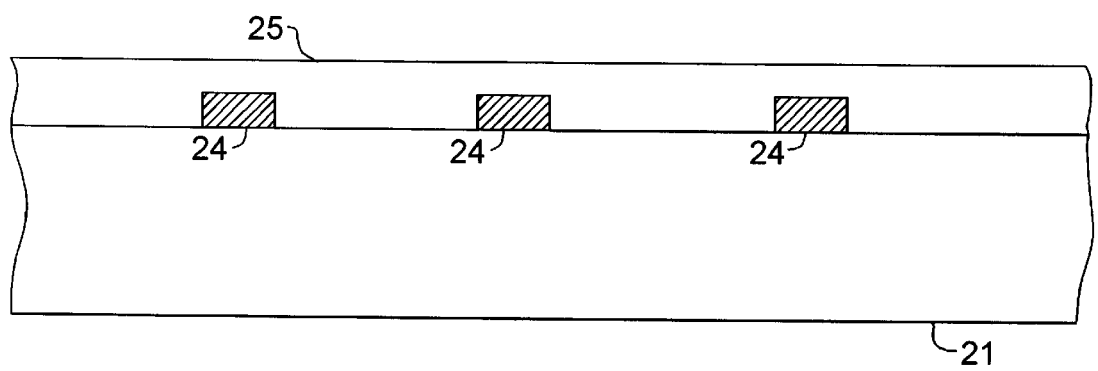

With reference to FIG. 5, the first interlevel dielectric 25 is formed over the first level metal pattern as shown. The interlevel dielectrics in the structures according to the invention may be chosen from a variety of insulating materials such as spin on glass (SOG), or $Si_3N_4$ or $SiO_2$ deposited by CVD for example. In the TFT structures described here, it is expected that the use of polymer materials wherever they can be effective will be desirable, both from the standpoint of processing simplicity and cost, and also to produce IC structures that tolerate strain, i.e. are somewhat flexible. Accordingly, for such applications the use of polyimide or similar organic polymer insulating material is recommended. A suitable material is a polyimide supplied by Nissan Chemical Company under the designation RN-812. This material can easily be deposited in layers with 0.1–1 $\mu$m thickness, which have desirable insulating properties. The application technique for organic insulators is typically spin coating or solution casting. Some inorganic insulators, notably spin-on-glass, also share the property of convenient application. In some applications, e.g. where fine pattern dimensions are not required, the dielectric layer may be applied as a patterned layer, already containing the interlevel windows.

Figure 6:
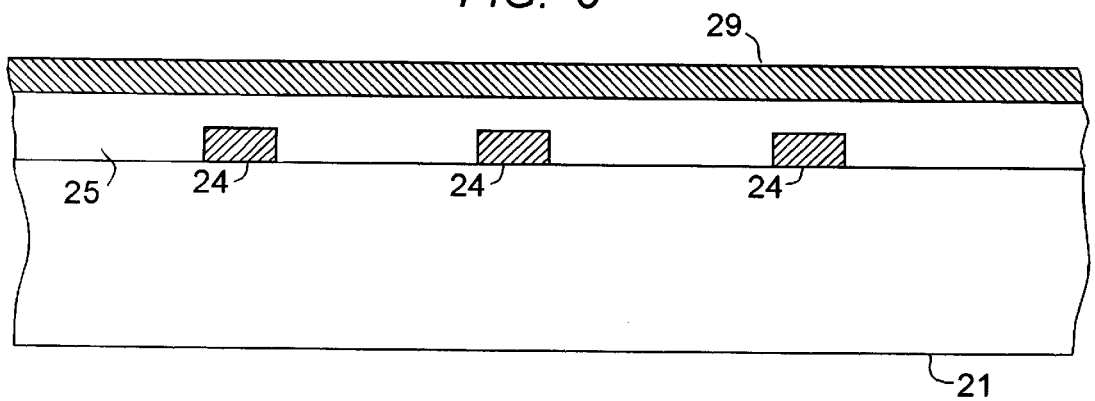
Figure 7:
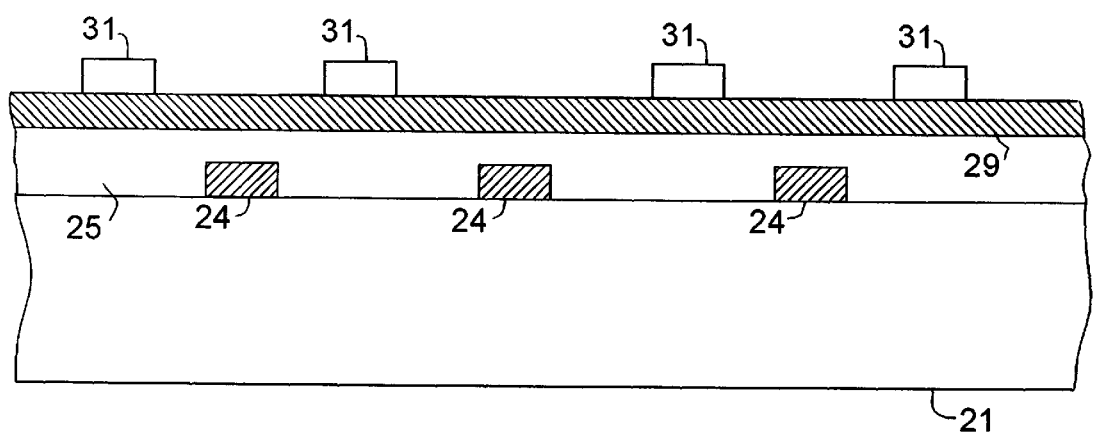
Figure 8:
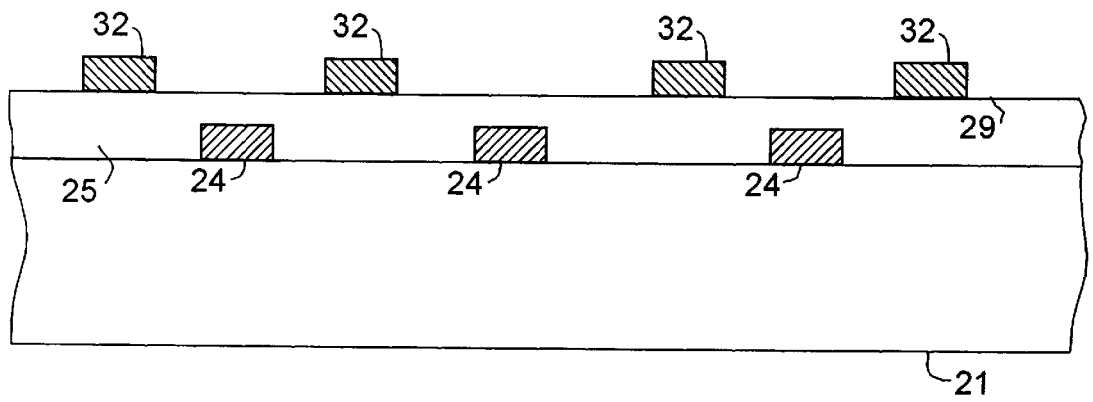

The second level metal, 29, is deposited over the first interlevel dielectric 25 as shown in FIG. 6. The second level metal may be the same as, or may be different from, the first level metal. The second level metal is patterned in a manner similar to the first level using mask 31 to form runners 32 as shown in FIGS. 7 and 8.

Figure 9:
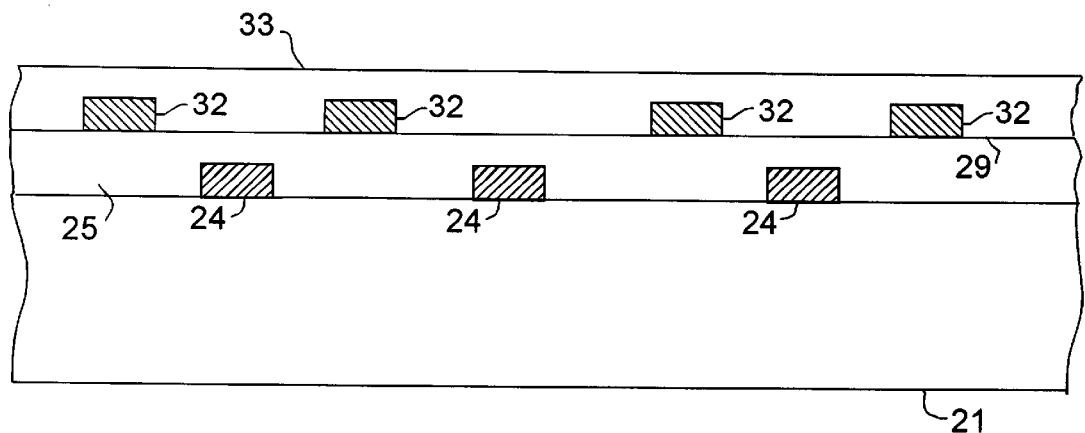
Figure 10:
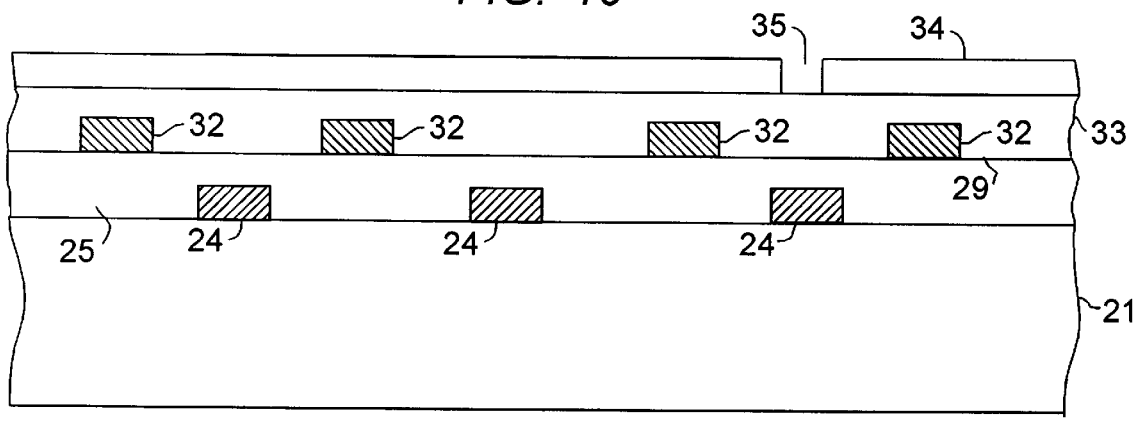
Figure 11:
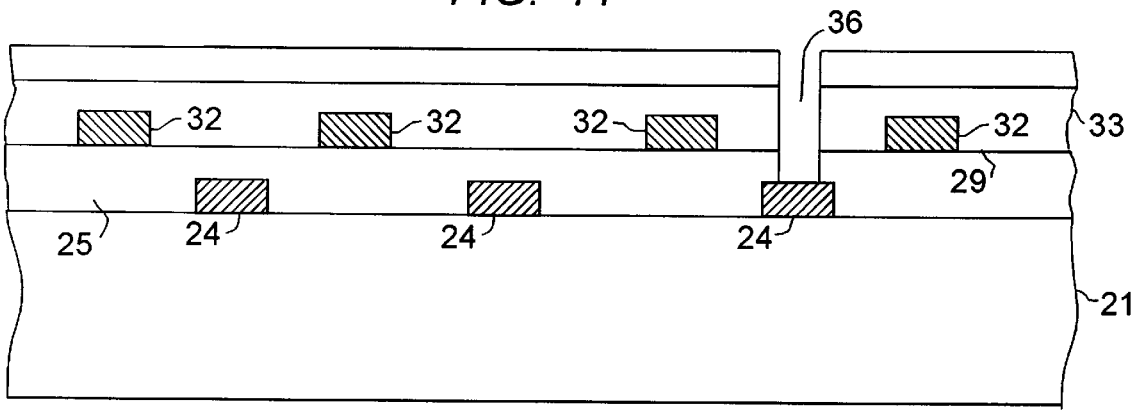

The next step forms the second interlevel dielectric 33 as shown in FIG. 9. This layer may be formed in a manner similar to layer 25. Interlevel dielectric 33 is provided with through holes or windows for interlevel interconnections between the first level (24) and the gate level to be formed next. The interlevel dielectric is masked with patterned mask 34 as shown in FIG. 10, and the portion of dielectric layer 33 exposed by the opening 35 in the resist is etched to form a window to interconnect the first and gate levels. The mask opening is aligned to metal runner 24 in the first level interconnection pattern. A single interlevel interconnection is shown for simplicity, but a typical IC will have many such interlevel interconnections. These interlevel interconnections are standard, and techniques for forming the interlevel windows are well known. For example, if the dielectric layer is $SiO_2$ the windows may be formed by plasma etching or RIE. The resulting structure is shown in FIG. 11, with interlevel window 36 formed in the dielectric layers 25 and 33. Alternatively, interlevel windows or vias can be made directly using a photodefinable polymer dielectric such as polyimide, or, if polymer material is used for the interlevel dielectric, the vias can be made using laser processing.

The gate level metal, usually the first level metal in a traditional structure, and usually of polysilicon, is formed late in the sequence of the invention, and may comprise a wide variety of metals. The usual requirement that the gate level metal be relatively refractory to withstand the conventional implantation drive steps is eliminated in the process of the invention, so the gate material can be selected from many materials, even aluminum or copper. However, the art has extensive experience with silicon gates insulated with grown $SiO_2$. Tantalum gates covered with TaN or TiN may also be convenient. Conducting polymers are also suitable for the gate metal and are especially compatible with other elements in the structures described here. Gold and indium tin oxide (ITO) are also useful gate electrode materials.

Figure 12:
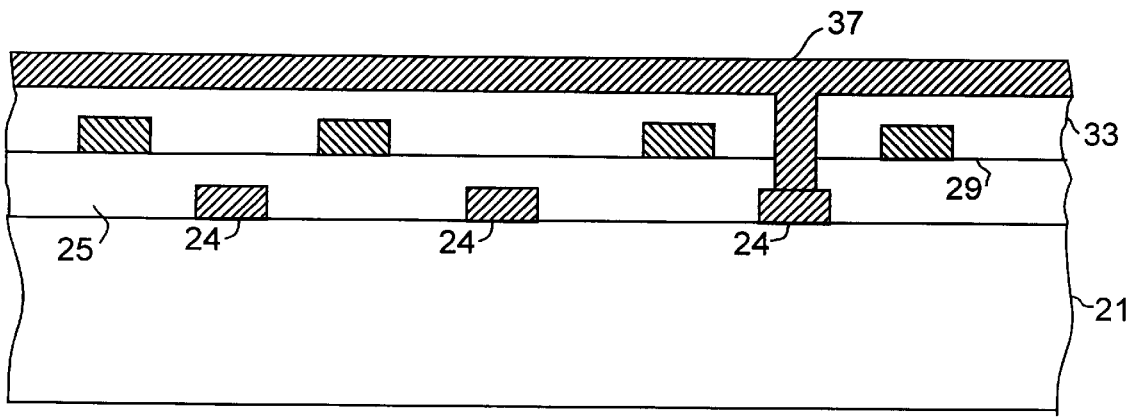
Figure 13:
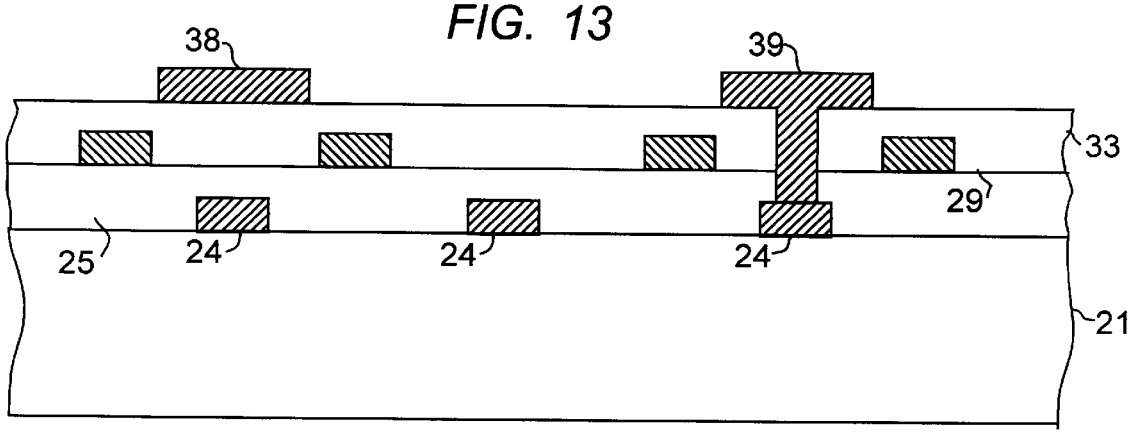

The gate metal layer 37 is shown in FIG. 12 deposited over the second interlevel dielectric layer 33 and into the windows that will interconnect selected gates to the first level metal. The gate metal layer is then patterned (FIG. 13) by lithography to form gate structures 38 and 39. Gate 38 is interconnected on the gate level and gate 39 is interconnected, in this illustrative arrangement, to runner 24 on the first level. For simplicity, the metal is shown deposited into the window as a part of the gate metal deposition step. As known by those skilled in the art, interlevel plug technologies can be used for forming the interlevel interconnections.

Figure 14:
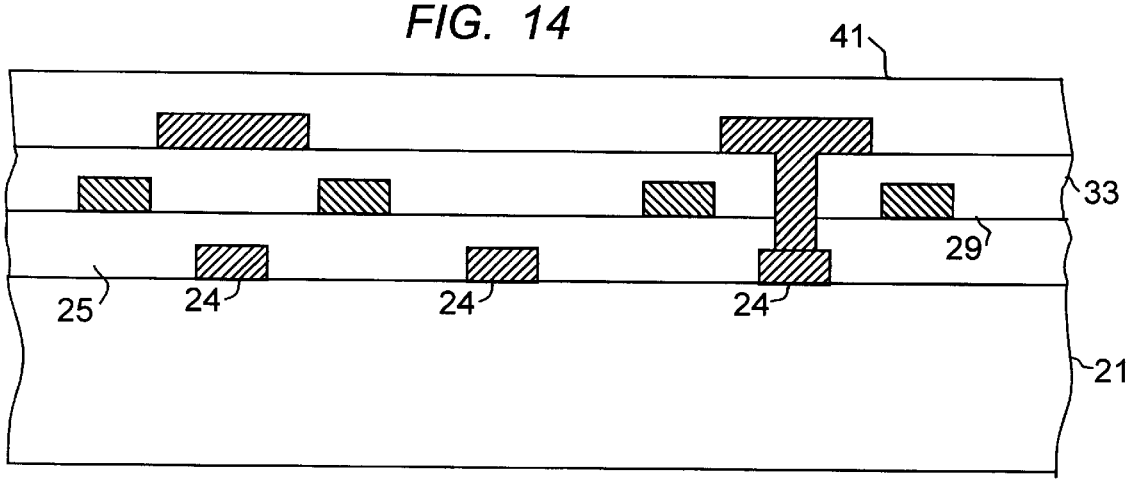

The gate dielectric 41 is then formed over the structure as shown in FIG. 14. The gate dielectric may be of a conventional oxide or nitride, or combination thereof such as 200 nm $Si_3N_4$ and 100 nm $SiO_2$, or may be $Al_2O_3$, deposited by r-f magnetron sputtering. The gate dielectric may also be SOG or an organic insulator such as polyimide that can be formed conveniently by spin-on techniques. An example of such a material that has been used successfully in this application is pre-imidized polyimide, supplied by Nissan Chemical Company under the designation SE-1180. This material can be spun on at 4000 RPM and cured at 120° C. for 2 hours to produce a coating with a thickness of 70 nm. If desired, the gate material may be polysilicon, and the gate dielectric grown as a surface layer over the polysilicon in which case the gate dielectric layer 41 would not cover the entire second interlevel dielectric as it appears in FIG. 14.

Figure 15:
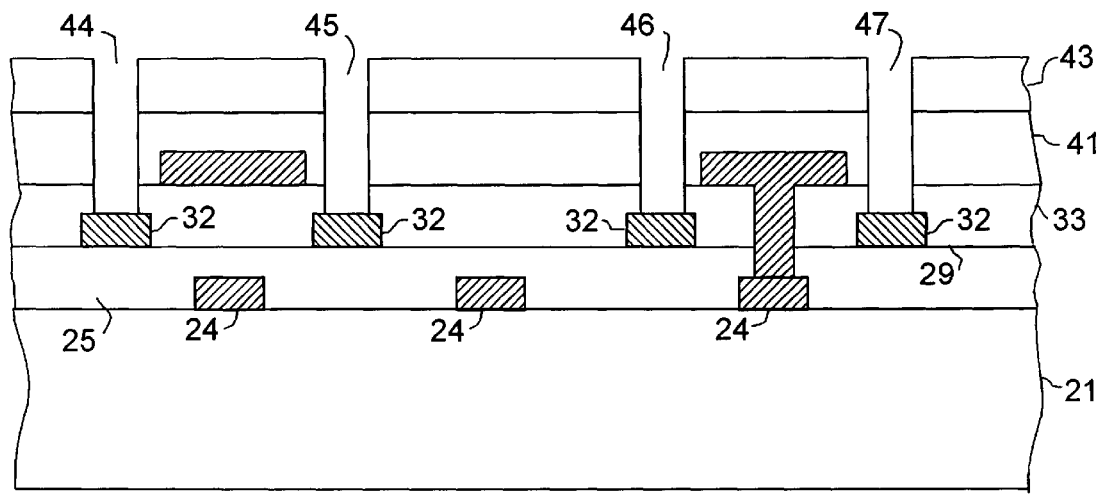

The gate dielectric is masked with patterned mask 43 as shown in FIG. 15, and the portion of gate dielectric layer 41 and the underlying portion of dielectric layer 33 exposed by the openings 44, 45, 46, and 47 in the resist, is etched to form a window to interconnect the source drain contacts to the second metal level. The mask openings are aligned to metal runners 32 in the second level interconnection pattern.

Figure 16:
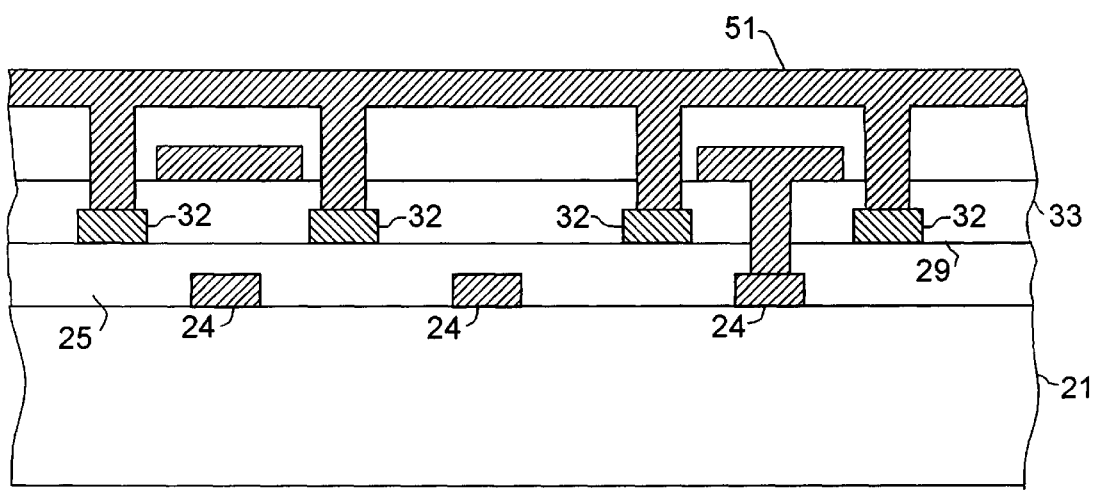
Figure 17:
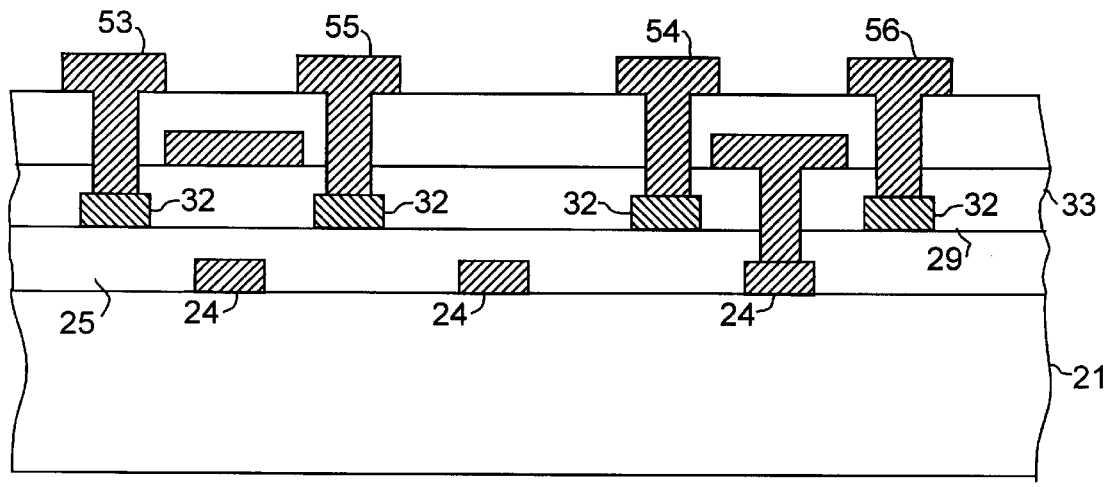

The interlevel plugs and the source/drain contact layer 51 is then deposited over the structure as shown in FIG. 16, and metal plug contact is made to the second level runners 32. Layer 51 is then patterned using a conventional lithographic mask (not shown) to define source electrodes 53, 54 and drain electrodes 55, 56, as shown in FIG. 17. As is well known, the position of the source and drain electrodes should be adjacent to the gate electrode in the vertical plane, or should overlap slightly the edge of the gate electrode. The formation of the source and drain contacts according to the invention will be described more fully below.

Figure 18:
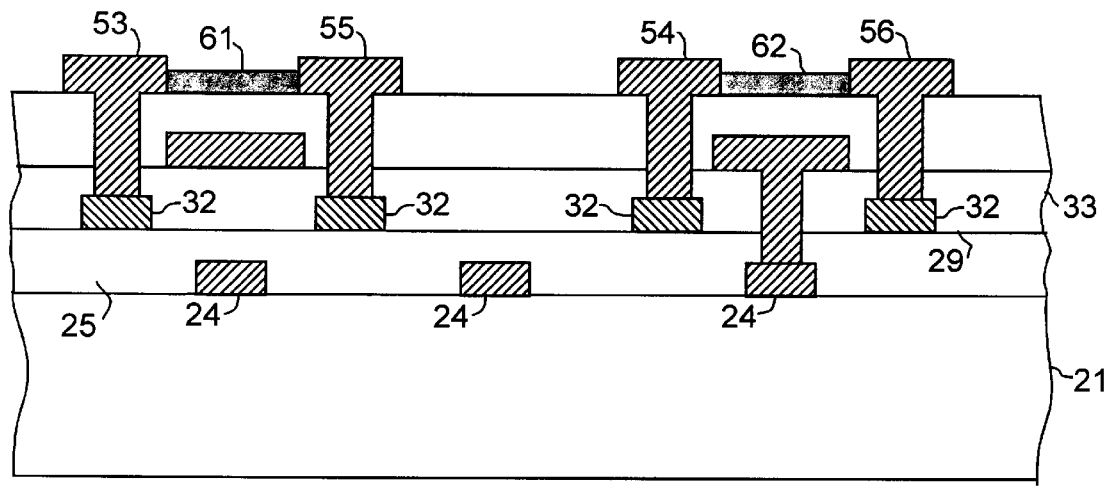

One of the last steps in the process of the invention, which is the first step in the traditional FET process, is illustrated in FIG. 18 and is the formation of the active semiconductor bodies 61, 62 in which the field effect is realized, and in which the FET channel extends between sources 53, 54 and drains 55, 56. The active material is an organic semiconductor.

A wide variety of organic semiconductors have now been developed for TFT devices. Among these are:

i. perylenetetracarboxylic dianhydride (PTCDA), the imide derivative of PTCDA;
ii. napthalenetetracarboxylic dianhydride (NTCDA);
iii. fluorinated copper pthalocyanine;
iv. α-sexithiophene;
v. tetracene or pentacene, or end substituted derivatives thereof;
vi. oligomers of thiophene with the degree of oligomerization $\geq 4$ and $\leq 8$, linked via the 2- and 5-carbons;
vii. alternating co-oligomers of thienylene and vinylene, with thiophenes as terminal groups and 3–6 thiophene rings, linked via their 2- and 5-carbons;
viii. linear dimers and trimers of benzo[1, 2-b: 4, 5-b'] dithiophene;
ix. oligomers of v. and vi. with substituents (e.g., alkyl substituents with 1–20 carbons) on the 4- or 5-carbon of the end thiophenes;
x. regioregular poly(thiophene)s.

Both p- and n-type materials are contained in this list and can be combined as needed for complementary ICs. In the development of this invention the material for the p-channel TFT devices was α-sexithiophene, and the material for the n-channel devices was copper hexadecafluorophthalocyanine ($F_{16}$CuPc).

Figure 19:
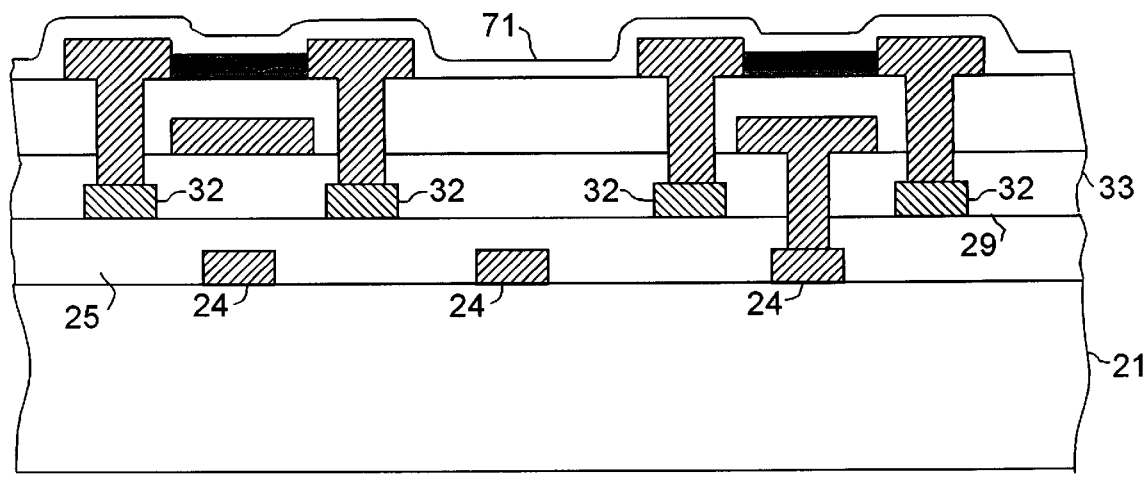

If necessary, the device can be sealed using a passivating layer 71 as shown in FIG. 19.

Figure 20:
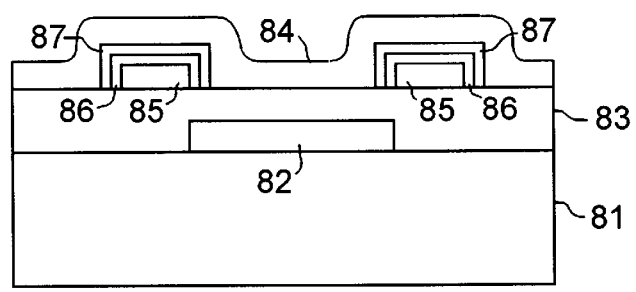
FIG. 20 is a diagram of a TFT device with multilayer source/drain electrodes made according to the invention.

The source and drain electrode material according to the invention is a layered structure comprising nickel and gold layers, preferably formed over $TiN_x$. A device structure, with multilayer source/drain contacts according to the invention, is shown schematically in FIG. 20. Substrate 81 has gate electrode 82 formed on the surface and gate dielectric 83 formed over the gate electrode. The organic semiconductor 84 in this embodiment is a blanket layer over the gate dielectric and source and drain electrodes. The source and drain electrodes comprise $TiN_x$ base 85, nickel layer 86, and gold layer 87. The $TiN_x$ layer may be formed by conventional deposition, e.g. reactive sputtering. The thickness of the source and drain contacts, as well as the thickness of the organic semiconductor layer 84 is relatively unimportant since the field effect occurs at the interface between layers 83 and 84. A thickness in the range 30–100 nm is suitable for these layers. The $TiN_x$ layer may be patterned by conventional photolithography, i.e. coating the $TiN_x$ layer with a photoresist, exposing the photoresist to actinic radiation to produce a photomask in the pattern of the source and drain electrodes, etching the $TiN_x$ layer to produce a source/drain electrode layer, and removing the photomask typically by ashing in a nitrogen plasma. The surface of the $TiN_x$ base layer is also cleaned by exposure to a plasma. The conventional cleaning plasma contains oxygen. It is important that the plasma for the cleaning operation in this process be substantially oxygen free. Formation of $TiO_2$ or a titanium oxynitride, which occurs on exposure of $TiN_x$ to an oxygen-containing plasma, is not compatible with subsequent processing. Plasma cleaning in a nitrogen plasma is therefore preferred. After cleaning, the $TiN_x$ is sensitized with a catalyst, preferably a palladium salt, such as $PdCl_2$, in HCl. $PdSO_4$, or other suitable Pd compound may also be used. The sensitized $TiN_x$ base layer is then plated using electroless nickel. A suitable nickel plating operation is given in the following example.

EXAMPLE I

A sensitizer solution is prepared by heating a 0.02N HCl solution to 50° C. and adding $PdCl_2$ (99.9%), while stirring, to produce a 6 g/L solution. The solution is filtered through a 0.2 μm nylon filter. The $TiN_x$ patterned substrates, after cleaning in a nitrogen plasma, are immersed in the sensitizer solution for 5 minutes at ambient temperature, followed by rinsing in deionized water. The activated $TiN_x$ is then plated by immersion of the substrate in the electroless plating solution for 30 s at 86° C.

Electroless nickel processing is well developed and widely used in industry. Deposition is typically performed in an acid phosphorus bath which produces a deposit with high conductivity, excellent uniformity, high hardness, and good adhesion to overplated materials. Electroless plating baths are characterized by the presence of a chemical reducing agent, usually alkali hypophosphite, and most commonly sodium hypophosphite, $NaH_2PO_2$. Alternative choices for reducing agents are sodium borohydride and dimethylamine-borane [$(CH_3)_2NHBH_3$] which deposits a Ni—B alloy. An effective nickel electroless plating solution, which deposits as a NiP alloy, is Type 4024 available from Fidelity Chemical Products Corp. Another effective electroless nickel plating solution which deposits as a NiP alloy is given in the following table.

TABLE 1

| | |
|---|---|
| Nickel sulfate (for $Ni^{+2}$) | 28 g/L |
| Sodium acetate (buffer) | 17 g/L |
| Sodium hypophosphite (reducing agent) | 24 g/L |
| Lead acetate (stabilizer) | 0.0015 g/L |
| pH | 4.4–4.6 |
| Temperature | 82–88° C. |

The thickness of the electroless nickel layer for this application is preferably in the range 0.2–1.0 μm.

The top layer of the multilayer contact is formed by displacement gold plating. Displacement plating is characterized by the absence of a reducing agent in the bath. The plating mechanism is by electro-kinetic displacement of gold for nickel in the surface layer of the nickel layer. It is facilitated by the surface porosity of the nickel, producing an upper gold layer with a thickness that is essentially self-limiting, and a lower gold-Ni intermetallic layer with a thickness which grows with time.

A suitable displacement plating bath for the gold layer is 8.40% potassium aurocyanide in 36.45% ammonia, and is available from Technic, Inc. as OROMERSE N. A suitable procedure is given in the following example.

EXAMPLE II

OMERSE N displacement gold solution is placed in a glass container. The pH of the solution is adjusted to 5.0–5.5 using ammonia, and heated to a temperature in the range 60° C.–70° C. using an immersion heater. The solution is preferably agitated while the substrates being plated are immersed. The gold layer plates at approximately 0.005–0.0075 μm /min. A layer thickness of 0.010–0.1 μm is suitable for the invention.

Figure 21:
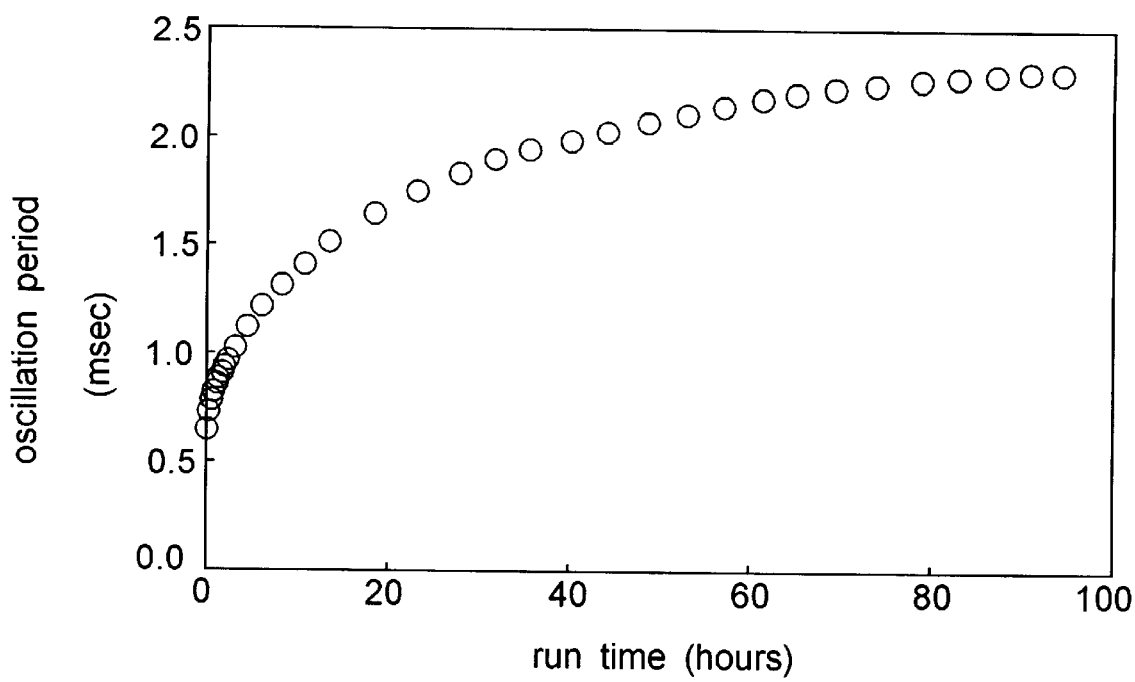
FIGS. 21 and 22 are plots showing improved lifetime characteristics for the devices of the invention.
Figure 22:
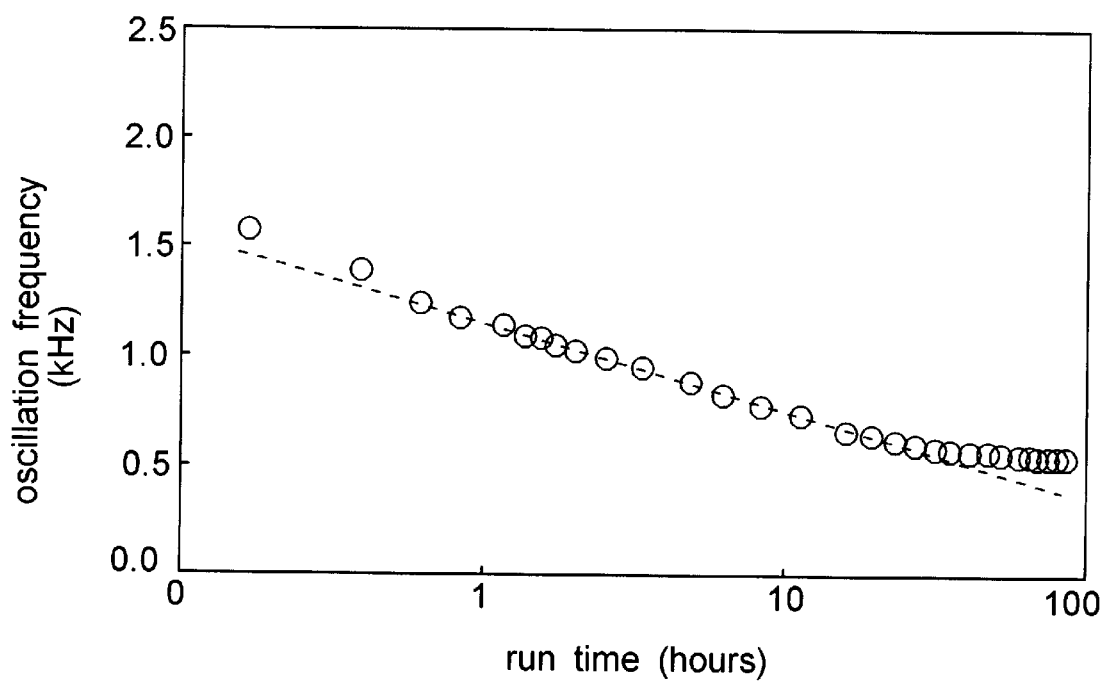

TFT devices produced in accordance with the invention show vastly improved aging characteristics over devices with electrodes formed by conventional techniques. This was demonstrated by aging experiments and the data is given in FIGS. 21 and 22. In FIG. 21 the oscillation period is plotted as a function of time. FIG. 22 gives data correlating the oscillation frequency with operating time. By contrast, devices with electrodes produced by conventional processing showed failures after just a few minutes of continuous operation.

An optional approach to the $TiN_x$/Ni/Au multilayer is to eliminate the $TiN_x$ layer and instead selectively apply a sensitizing layer directly to the dielectric surface. A recommended sensitizing layer is carbon containing a suitable catalyst such as Pd. Particulate carbon, containing particulate Pd, in a suitable binder or ink carrier can be applied selectively by an additive technique such as screen printing, ink jet printing, contact printing, microprinting, or the like.

The TFT structure described and produced by the foregoing sequence of steps is but one form of TFT to which the invention can be applied. An alternative is a conventional MOS transistor structure in which the organic semiconductor is the substrate, the source and drain electrodes are applied to the organic semiconductor substrate, the gate dielectric is formed on the organic semiconductor substrate, and then the gate electrode is formed.

Another alternative transistor structure for TFT devices is a modified form of J-FET with n-type and p-type layers together forming a p-n junction. A gate controls the pinch-off of the channel between source and drain.

As indicated earlier, the features in the figures are not necessarily to scale. The dimensions of the active devices, i.e. the TFTs, can be made very small using fine line techniques. In particular, the source-to-drain spacing can be 5 nm or less. At these small dimensions a single polymer chain, or a few organic molecules span the source-to-drain distance. With such an IC technology, it is possible to achieve extremely high integration densities. The molecular nature of organic/polymer semiconductors allows the size of such transistors to shrink to such small dimensions, and also enables effective isolation between individual transistors. The dimensions of some of the interconnections, e.g. power and ground interconnections, may be significantly larger than those that appear in the figures.

The process sequence shown above for making the CMOS inverter circuit has three metal levels, partly to show the potential of the process for making more complex circuits. It will be evident to those skilled in the art that the simple inverter of FIG. 1 can be made with two levels of interconnect if the n- and p-devices are properly arranged for negative and positive supply busses on the same level.

As known by those skilled in the art, the nickel layer described at several places above, when formed by electroless plating, is typically a Ni alloy, preferably an alloy of phosphorus. Reference to nickel layers herein, and in the appended claims, is intended to refer to this form of nickel.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for manufacturing an integrated circuit thin film transistor device comprising:
   a. preparing a substrate, said substrate comprising an organic semiconductor material,
   b. forming a plurality of field effect thin film transistors on said substrate said plurality of thin film field effect transistors made by the steps comprising:
      1. forming a source electrode on said substrate,
      2. forming a drain electrode on said substrate and spaced from said source electrode leaving a channel location therebetween,
      3. depositing a dielectric layer covering both said source electrode and said drain electrode, and
      4. forming a gate electrode overlying said channel location, the invention characterized in that the source and drain electrodes are formed by the steps of:
         i. forming a patterned conductive base layer to define the area of the source and drain electrodes,
         ii. depositing a layer of nickel on said patterned conductive base layer by electroless plating, and
         iii. depositing a layer of gold on said layer of nickel by displacement plating.

2. The method of claim 1 wherein the base layer is $TiN_x$.

3. A method for the manufacture of an integrated circuit thin film transistor device comprising the steps of:
   a. depositing an electrically conductive layer on an insulating substrate,
   b. lithographically patterning said electrically conductive layer to form an interconnect circuit,
   c. depositing an insulating layer over said interconnect circuit,
   d. forming a plurality of thin film field effect transistors on said insulating layer, said plurality of thin film field effect transistors made by the steps of:
      1. forming a field effect transistor gate,
      2. forming a gate dielectric layer over said field effect transistor gate,
      3. forming spaced apart source and drain electrodes, and
      4. forming an organic semiconductor layer between said source and drain electrodes,
   e. interconnecting said field effect transistor gate to said interconnect circuit, the invention characterized in that the source and drain electrodes are formed by the steps of:

i. forming a patterned conductive base layer to define the area of the source and drain electrodes,
   ii. depositing a layer comprising nickel on said patterned conductive base layer by electroless plating, and
   iii. depositing a layer of gold on said layer of nickel by displacement plating.

4. The method of claim 3 wherein the conductive base layer is $TiN_x$.

5. A method for the manufacture of an integrated circuit thin film transistor device comprising forming a plurality of thin film field effect transistors on an insulating layer, said plurality of thin film field effect transistors comprising a source electrode, a drain electrode, a gate electrode, and an organic semiconductor active layer, said source and drain electrodes made by the steps of:
   a. forming a patterned conductive base layer to define the area of the source and drain electrodes,
   b. depositing a layer comprising nickel on said patterned conductive base layer by electroless plating, and
   c. depositing a layer of gold on said layer of nickel by displacement plating.

6. A method for the manufacture of an integrated circuit thin film transistor device comprising forming a plurality of thin film field effect transistors on an insulating layer, said plurality of thin film field effect transistors comprising a source electrode, a drain electrode, a gate electrode, and an organic semiconductor active layer, said source and drain electrodes made by the steps of:

a. depositing a $TiN_x$ layer, b. coating said $TiN_x$ layer with a photoresist, c. exposing said photoresist to actinic radiation to produce a photomask in the pattern of said source and drain electrodes, d. etching said $TiN_x$ layer to produce a source and drain electrode layer, e. removing said photomask, f. cleaning said source and drain electrode layer by exposing said layer to an essentially oxygen-free plasma, g. depositing a layer comprising nickel on said patterned conductive base layer by electroless plating, and h. depositing a layer of gold on said layer of nickel by displacement plating.

* * * * *